United States Patent
Hong

(10) Patent No.: US 7,544,601 B2
(45) Date of Patent: Jun. 9, 2009

(54) SEMICONDUCTOR DEVICE AND A METHOD FOR MANUFACTURING THE SAME

(75) Inventor: Ji Ho Hong, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 41 days.

(21) Appl. No.: 11/559,610

(22) Filed: Nov. 14, 2006

(65) Prior Publication Data

US 2007/0128847 A1 Jun. 7, 2007

(30) Foreign Application Priority Data

Nov. 15, 2005 (KR) .................. 10-2005-0109051

(51) Int. Cl.
*H01L 21/4763* (2006.01)

(52) U.S. Cl. .................. 438/618; 257/E21.579

(58) Field of Classification Search .......... 438/618, 438/637, 622
See application file for complete search history.

(56) References Cited

U.S. PATENT DOCUMENTS

| | | | | |
|---|---|---|---|---|
| 6,110,648 | A * | 8/2000 | Jang | 430/312 |
| 6,114,243 | A * | 9/2000 | Gupta et al. | 438/687 |
| 6,251,786 | B1 * | 6/2001 | Zhou et al. | 438/692 |
| 6,734,559 | B1 * | 5/2004 | Yang et al. | 257/751 |
| 6,893,959 | B2 * | 5/2005 | Barth | 438/637 |
| 6,943,111 | B2 * | 9/2005 | Lin et al. | 438/687 |
| 7,190,079 | B2 * | 3/2007 | Andricacos et al. | 257/774 |
| 7,348,272 | B2 * | 3/2008 | Sung | 438/624 |
| 2003/0060036 | A1 * | 3/2003 | Hsu et al. | 438/637 |
| 2003/0071355 | A1 * | 4/2003 | Dubin et al. | 257/751 |
| 2004/0084773 | A1 * | 5/2004 | Johnston et al. | 257/751 |
| 2004/0137721 | A1 * | 7/2004 | Lim et al. | 438/638 |
| 2005/0001325 | A1 * | 1/2005 | Andricacos et al. | 257/762 |
| 2005/0121808 | A1 * | 6/2005 | Hasunuma et al. | 257/788 |
| 2005/0153537 | A1 * | 7/2005 | Cheng et al. | 438/627 |
| 2005/0263902 | A1 * | 12/2005 | Lin et al. | 257/762 |
| 2006/0105565 | A1 * | 5/2006 | Liu et al. | 438/633 |
| 2006/0113675 | A1 * | 6/2006 | Chang et al. | 257/763 |
| 2006/0202342 | A1 * | 9/2006 | Andreyushchenko et al. | 257/758 |
| 2006/0205204 | A1 * | 9/2006 | Beck | 438/628 |
| 2006/0286797 | A1 * | 12/2006 | Zhang et al. | 438/659 |
| 2007/0020931 | A1 * | 1/2007 | Koura et al. | 438/687 |
| 2007/0111522 | A1 * | 5/2007 | Lim et al. | 438/682 |
| 2007/0249156 | A1 * | 10/2007 | Bonilla et al. | 438/622 |
| 2008/0096384 | A1 * | 4/2008 | Anderson et al. | 438/653 |

FOREIGN PATENT DOCUMENTS

| | | |
|---|---|---|
| KR | 1020020054662 A | 7/2002 |
| KR | 1020030053542 A | 7/2003 |
| WO | WO 2005/067032 | 7/2005 |

* cited by examiner

*Primary Examiner*—Thao P. Le
(74) *Attorney, Agent, or Firm*—Sherr & Vaughn, PLLC

(57) ABSTRACT

Disclosed are embodiments relating to a semiconductor device and a method of manufacturing a semiconductor device that may prevent an increase of a dielectric effective constant of the IMD. In embodiments, a semiconductor device may include a substrate having a source/drain area, a gate electrode formed on the semiconductor substrate, a first inter-metal dielectric layer formed on the semiconductor substrate and having a first damascene pattern, a first barrier layer formed on the damascene pattern, a first metal line formed on the first barrier layer, and a first metal capping layer formed in the first damascene pattern.

7 Claims, 8 Drawing Sheets

SEMICONDUCTOR DEVICE AND A METHOD FOR MANUFACTURING THE SAME

The present application claims priority under 35 U.S.C. 119 and 35 U.S.C. 365 to Korean Patent Application No. 10-2005-0109051 (filed on Nov. 15, 2005), which is hereby incorporated by reference in its entirety.

BACKGROUND

Embodiments relate to a semiconductor device and a method for manufacturing the same. Metal interconnections of a semiconductor device may connect circuits formed in a semiconductor substrate to each other. This may be done through electrical connections and pad connections between semiconductor devices, for example by using a metal thin film, that may include aluminum, aluminum alloys, and/or copper.

To connect a pad with an electrode, which may be insulated from each other by an insulating layer such as, for example, an oxide layer, a contact hole may be formed, for example by selectively etching the insulating layer. A metal plug for filling the contact hole may then be formed, for example by using barrier metal or tungsten.

After forming a metal thin film on the resultant structure, the metal thin film may be patterned to form a metal interconnection to connect the pad with the electrode.

To pattern a metal interconnection, a photolithography process may be used. Because, however, the critical dimension (CD) of the metal interconnection has been reduced as semiconductor devices have been fabricated in smaller sizes, it may become difficult to form a micro-pattern of the metal interconnection through a photolithography process.

For this reason, a damascene process has been proposed that may more easily form metal interconnections having a micro-pattern.

A metal interconnection formed through such a damascene process may have a multi-layer structure. For a multi-layer metal interconnection including copper, a barrier layer (for example including SiN and SiCN) may be formed on the entire surface of a lower copper metal interconnection and a lower inter-metal dielectric (IMD) layer to prevent the diffusion of a lower copper metal interconnection into an upper IMD layer that may surround the upper copper metal interconnection.

This may have various problems. For example, as a barrier layer may be formed on the entire surface of the lower copper metal interconnection and the lower IMD layer, an effective dielectric constant (k) of the lower IMD layer may increase, thereby causing an RC delay. Thus, the reliability of a semiconductor device may be degraded.

SUMMARY

In embodiments, a semiconductor device and a method for manufacturing the same may be capable of improving the reliability of a semiconductor device, and may prevent the increase of an effective dielectric constant of an IMD layer caused by a barrier layer of the semiconductor device.

In embodiments, a semiconductor device may include a semiconductor substrate having a source/drain area, a gate electrode formed on the semiconductor substrate, a first inter-metal dielectric layer formed on the semiconductor substrate and having a first damascene pattern, a first barrier layer formed on the damascene pattern, a first metal line formed on the first barrier layer, and a first metal capping layer formed in the first damascene pattern.

In embodiments, a method for manufacturing a semiconductor device may include forming a first inter-metal dielectric layer on a semiconductor substrate, and forming a first damascene pattern in the first inter-metal dielectric layer, forming a first barrier layer and a first metal line in the first damascene pattern, forming a first metal capping layer on the first metal line in the first damascene pattern, and forming a second inter-metal dielectric layer on the first metal capping layer.

According to embodiments, a metal capping layer may be only on a metal interconnection, so it may be possible to prevent atoms included in the metal interconnection from being diffused into an IMD.

In addition, it may be possible to prevent an increase of a dielectric effective constant of the IMD by the metal capping layer, according to embodiments.

DETAILED DESCRIPTION OF EMBODIMENTS

Figure 1:
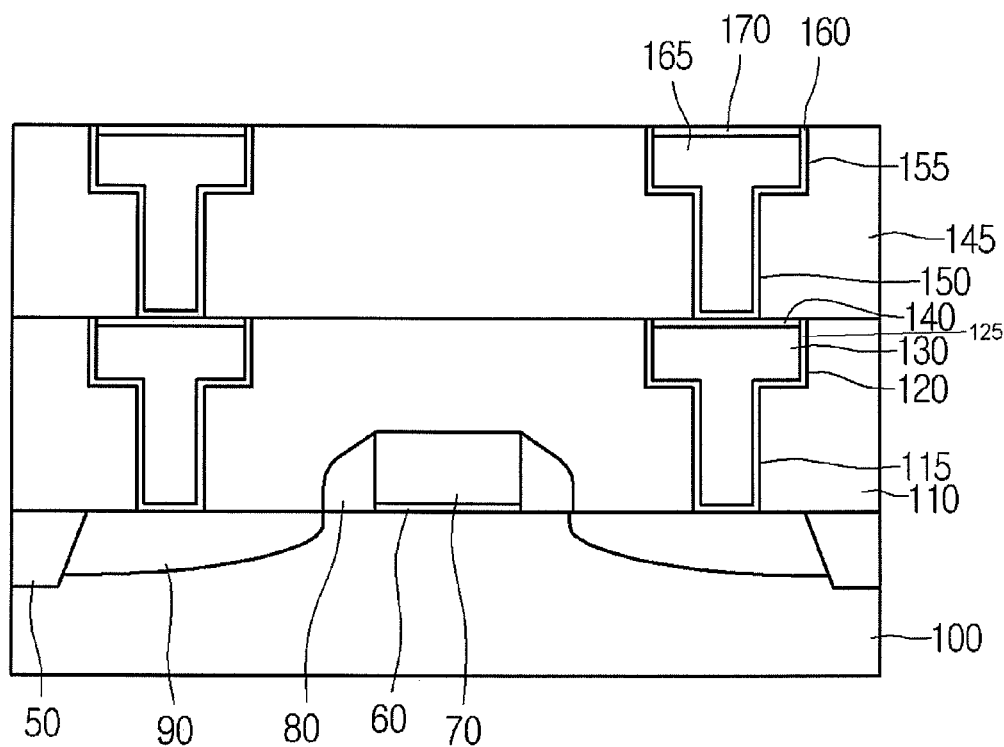
FIG. 1 illustrates a structure of a semiconductor device according to embodiments.

FIG. 1 illustrates a structure of a semiconductor device according to embodiments.

Referring to FIG.1, gate insulating layer 60 and gate electrode 70 may be sequentially formed on semiconductor substrate 100. Isolation layer 50 and source/drain area 90 (or a high-density junction area) may also be formed. Spacers 80 may be formed at sides of gate insulating layer 60 and gate electrode 70, respectively.

First inter-metal dielectric (IMD) layer 110 may be formed on semiconductor substrate 100, and first via hole 115 and first trench 120 may be formed in first IMD layer 110.

First barrier layer 125 may be formed in inner walls of first via hole 115 and first trench 120, and a first metal interconnection 130 may be formed on first barrier layer 125.

After first metal interconnection 130 may be formed thereon, first dielectric metal capping layer 140, that may be capable of reducing an effective dielectric constant (effective k) of first IMD layer 110, may be formed above first metal interconnection 130. First metal capping layer 140 may include dielectric materials, such as, for example SiN, SiCN, Ti, TiN, and/or Ru.

In other words, first metal capping layer 140 may be formed on first metal interconnection 130 in first trench 120.

Second IMD layer 145 may be formed on first IMD layer 110 and first metal capping layer 140. Second via hole 150 and second trench 155 may be formed in second IMD layer 145. Second barrier layer 160 may be formed in an inner wall of second via hole 150 and second trench 155, and second metal interconnection 165 may be formed on second barrier layer 160.

After second metal interconnection 165 may be formed thereon, second metal capping layer 170, that may be capable of lowering an effective dielectric constant of second IMD layer 145 and preventing the diffusion of atoms included in second metal interconnection 165, may be formed above second metal interconnection 165. Second metal capping layer 170 may include dielectric materials, for example such as SiN, SiCN, Ti, TiN, and/or Ru.

Together with barrier layers 125 and 160, first and second capping layers 140 and 170 may prevent the metal interconnections 130 and 165 from diffusing into IMD layers 110 and 145.

First and second IMD layers 110 and 145 may include materials having a low effective dielectric constant, such as phosphorous silicate glass (PSG), boron phosphorous silicate glass (BPSG), fluorine doped silicate glass (FSG), and undoped silicate glass(USG) having a low effective dielectric constant.

FIGS. 2 to 8 illustrate a semiconductor device and a method for manufacturing a semiconductor device, according to embodiments.

Figure 2:
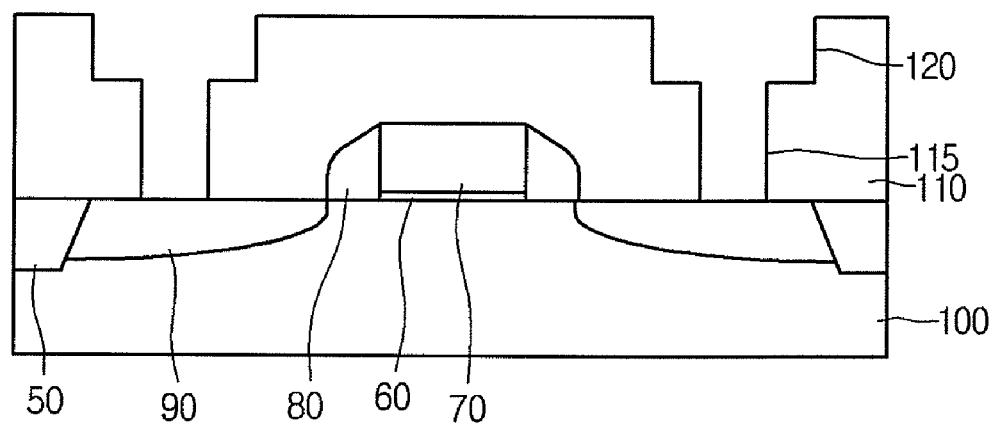
FIGS. 2 to 8 illustrate a semiconductor devise and a method for manufacturing a semiconductor device according to embodiments.

Referring to FIG. 2, gate insulating layer 60 and gate electrode 70 may be sequentially formed on semiconductor substrate 100, and may be formed with the isolation layer 50 and source/drain area 90.

Spacer 80 may be formed at sides (for example, at both sides) of gate insulating layer 60 and gate electrode 70, and first IMD layer 110 may be formed on semiconductor substrate 100.

A via hole pattern may be formed on first IMD layer 110, for example by using a photoresist film, and first IMD layer 110 may be etched, for example by using the via hole pattern as a mask, and may thereby form first via hole 115 in semiconductor substrate 100.

A trench pattern may be formed on first IMD layer 110, for example by using a photoresist film, and an upper portion of first IMD layer 110 may be removed, for example by using the trench pattern as a mask, and may thereby form first trench 120.

First via hole 115 and first trench 120 may form a damascene pattern. In the following description, together with the use of the term "via hole" and "trench" the term "damascene pattern" will be used as it includes a via hole and a trench.

In other words, first via hole 115 and first trench 120 may be formed in first IMD layer 110 to form the damascene pattern for forming a metal interconnection in first IMD layer 110.

Figure 3:
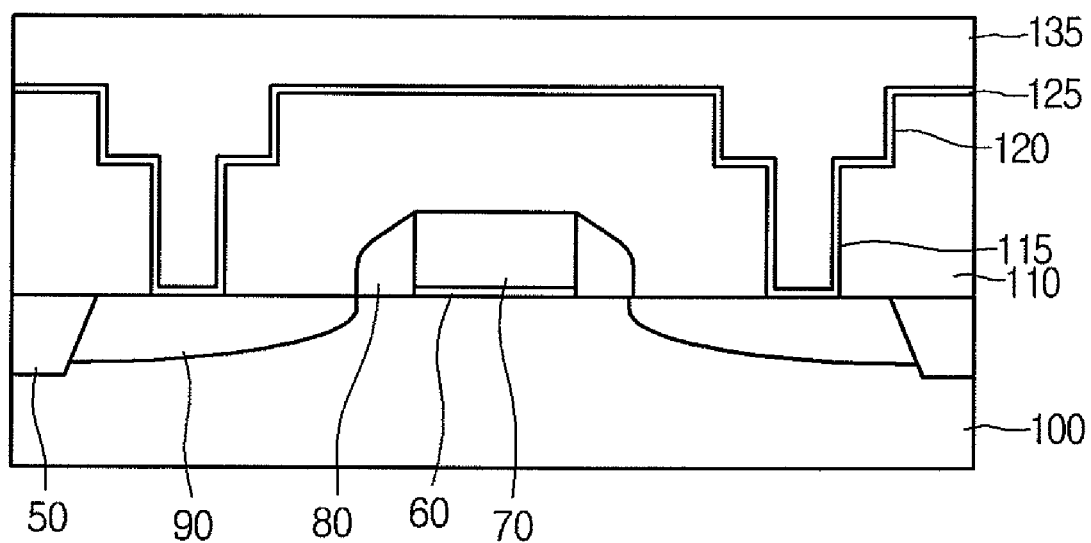

Referring to FIG. 3, first barrier layer 125 may be formed in the damascene pattern including first via hole 115 and first trench 120, and first metal layer 135 may be formed on first barrier layer 125. First metal layer 135 may include Cu.

First barrier layer 125 may be formed through a chemical vapor deposition (CVD) process, a physical vapor deposition (PVD) process, or an atomic layer deposition (ALD) process. Other known methods could also be used to form first barrier layer 125.

Figure 4:
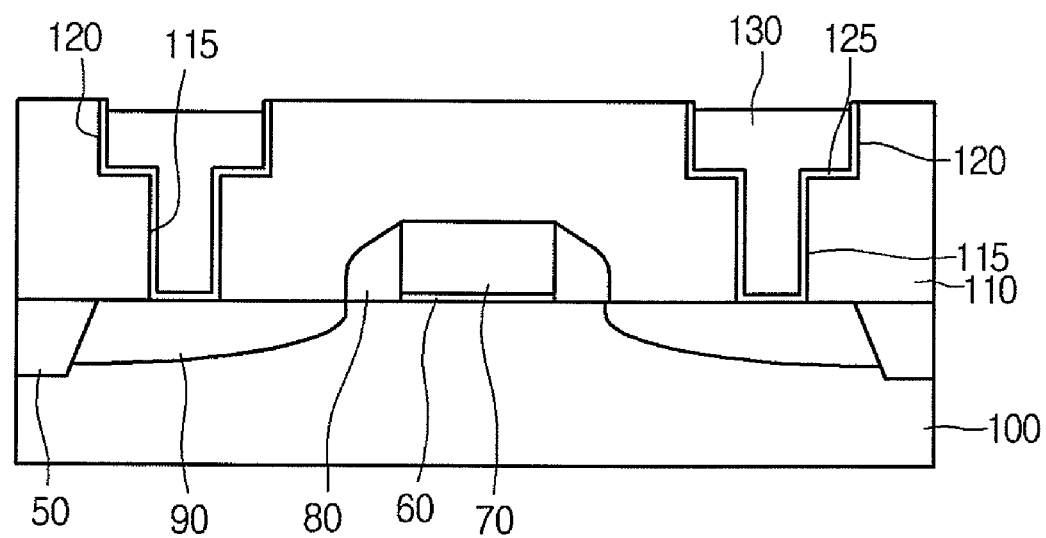

Referring to FIG. 4, first metal layer 135 and first barrier layer 125 may be polished, for example through a chemical mechanical polishing (CMP) process, and may thereby form first metal interconnection 130 in the damascene pattern.

When first metal layer 135 and first barrier layer 125 are polished, a slurry solution having higher etching selectivity to first metal layer 135 than first barrier layer 125 may be used. Accordingly, after performing the CMP process, first metal layer 135 of the upper part of first IMD layer 110 may be removed, and first metal interconnection 130 may be formed in the damascene pattern including first via hole 115 and first trench 120.

In embodiments, when polishing first metal layer 135 so as to form first metal interconnection 130 with a slurry solution having higher etching selectivity to first metal layer 135 than first barrier layer 125, a height of first metal interconnection 130 may become lower than a height of first IMD layer 110.

To form first metal interconnection 130 having the height lower than the height of first IMD layer 110, a wet etching process may be performed with respect to first metal interconnection 130 by using a predetermine mask pattern after performing the CMP process for planarizing first IMD layer 110 and first metal interconnection 130.

Figure 5:
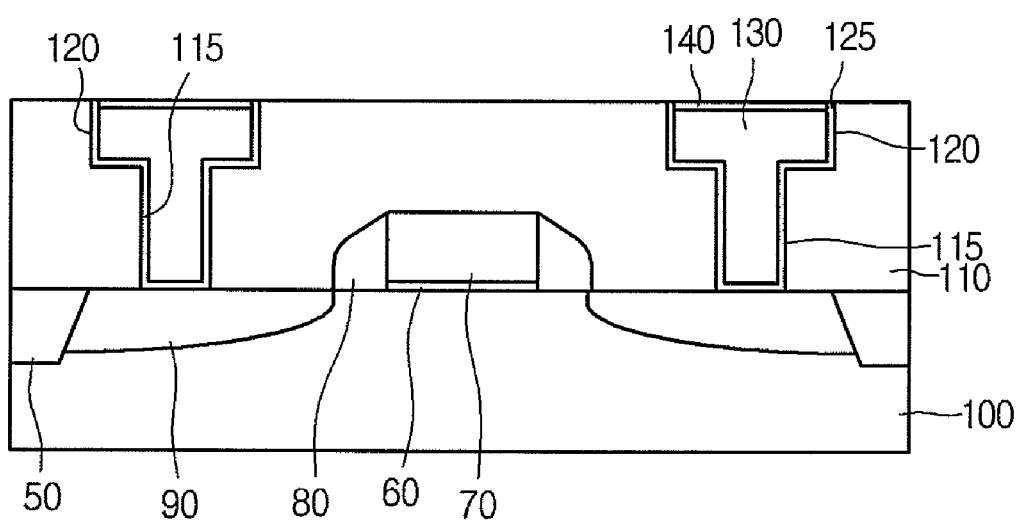

Referring to FIG. 5, first metal capping layer 140 may be formed on first metal interconnection 130 such that a height of first metal capping layer 140 may be identical to a height of first IMD layer 110, in embodiments. In other words, first metal capping layer 140 may be formed in first trench 120 of the damascene pattern in first IMD layer 110.

In embodiments, first metal capping layer 140 may include dielectric materials such as, for example, Ti, SiN, SiCN, TiN, and/or Ru.

First metal capping layer 140 may be formed on first metal interconnection 130. Thus it may be possible to prevent an effective dielectric constant (effective k) from being increased by a barrier layer existing on an entire surface of an IMD layer. In addition, it may be possible to prevent a diffusion of copper (Cu) atoms included in first metal interconnection 130.

Figure 6:
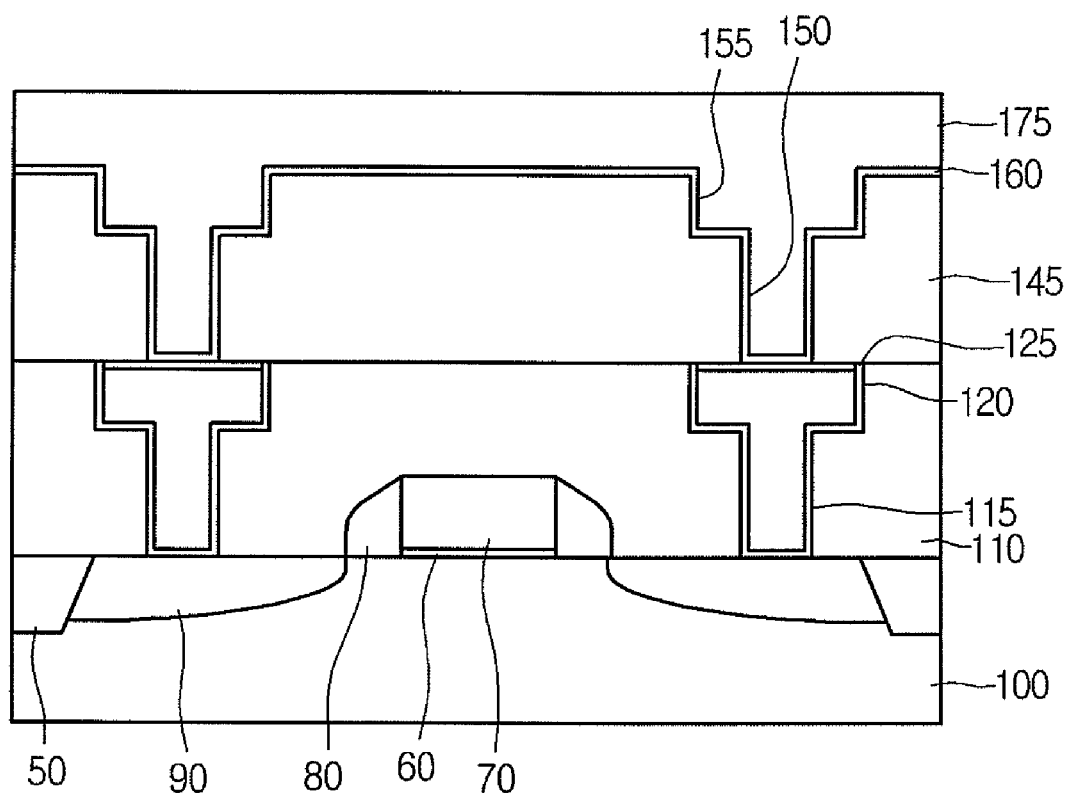

Referring to FIG. 6, second IMD layer 145 may be formed on first IMD layer 110 and first metal capping layer 140, and second via hole 150 and second trench 155 may be formed in second IMD layer 145. The method for forming second via hole 150 and second trench 155 may be identical to the method for forming first via hole 115 and first trench 120.

In embodiments, as second via hole 150 and second trench 155 may be formed in second IMD layer 145, a second damascene pattern may be formed.

Second barrier layer 160 and second metal layer 175 may be formed on the second damascene pattern (that is, the second via hole and the second trench) and second IMD layer 145. In embodiments, since a portion of first metal capping layer 140 may be exposed in the process of forming second via hole 150, second metal layer 175 may be formed after removing a portion of first metal capping layer 140.

Portions of second metal layer 175 and second barrier layer 160 (for example, formed on second IMD layer 145) may be removed through a CMP process.

Figure 7:
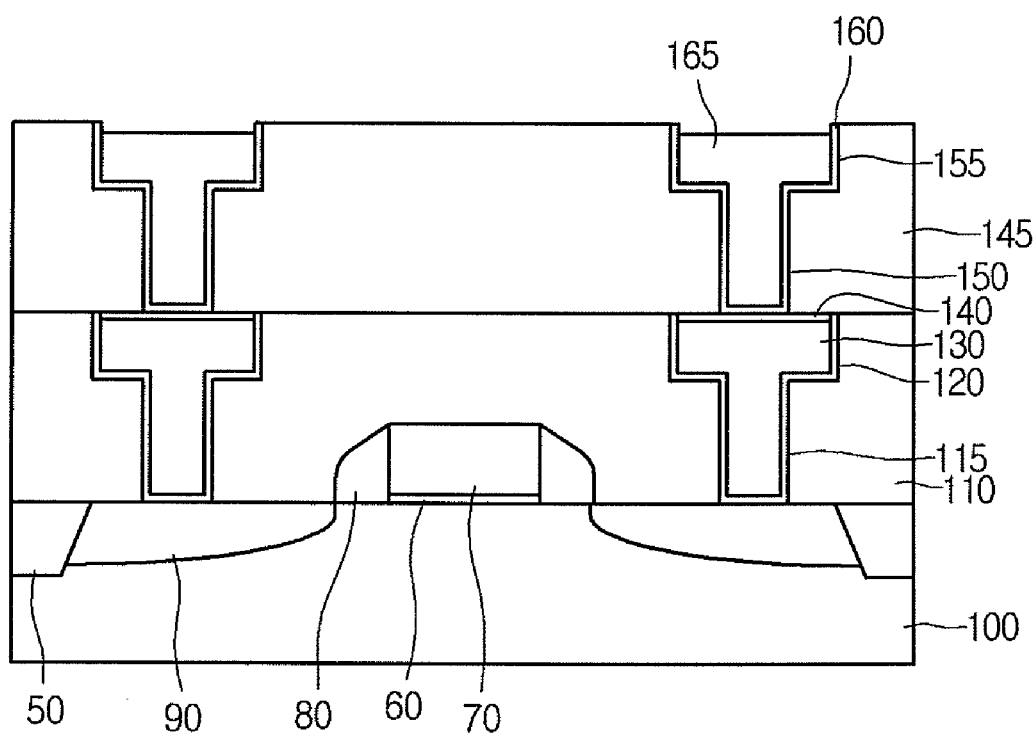

Referring to FIG. 7, in embodiments, second metal layer 175 may become second metal interconnection 165 existing in the second damascene pattern through the CMP process.

Thus, when the CMP process is performed to form second metal interconnection 165, a slurry solution having higher etching selectivity to the metal layer than the barrier layer may be used, so that a height of second metal interconnection 165 may be lower than a height of second IMD layer 145 after the CMP process.

Second metal interconnection 165, which may have a height lower than a height of second IMD layer 145, may be formed through a wet etching process as described above.

Figure 8:
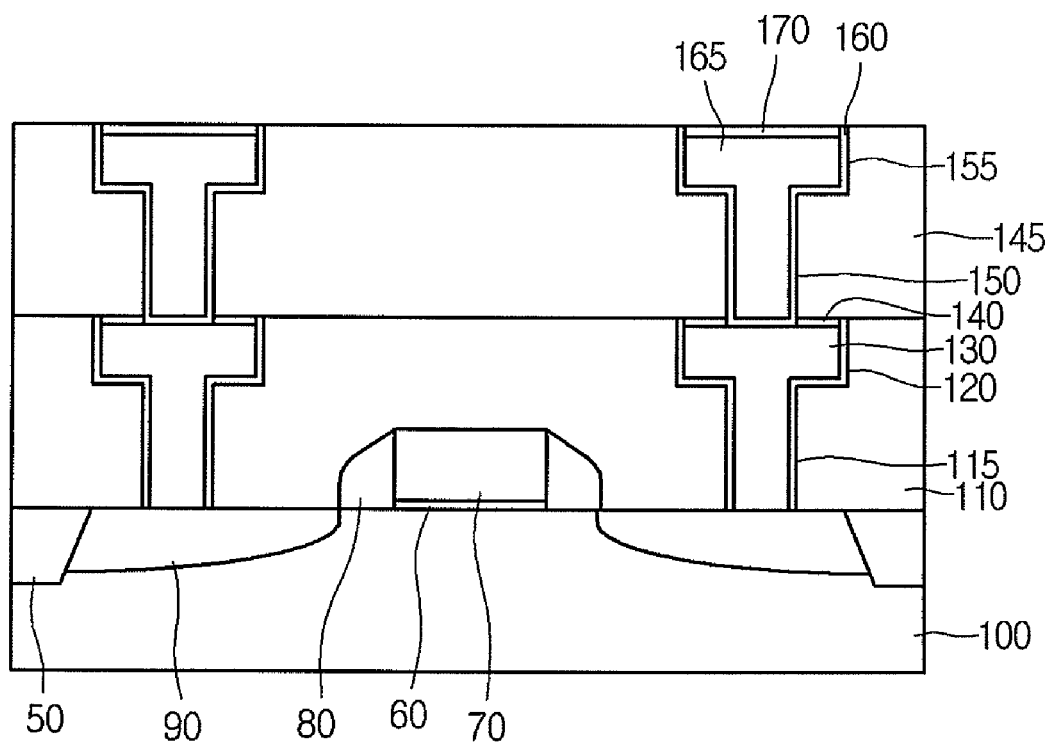

Referring to FIG. 8, second metal capping layer 170 may be formed on second metal interconnection 165. In embodiments, second metal capping layer 170 may include dielectric materials such as, for example, Ti, SiN, SiCN, TiN, or Ru.

According to embodiments, first and second metal capping layers may be formed only on first and second metal interconnection. In other words, the first and second metal capping layers may not exist on a surface of IMD layers.

Hence, the metal capping layer including dielectric materials may not be formed on the surface of the IMD. It may thus be possible to reduce or prevent an increase of an effective dielectric constant of the IMD. In addition, an RC delay may be prevented, so that it may be possible to improve the reliability of a semiconductor device.

It will be apparent to those skilled in the art that various modifications and variations can be made to embodiments.

Thus, it is intended that embodiments cover modifications and variations thereof within the scope of the appended claims. It is also understood that when a layer is referred to as being "on" another layer or substrate, it can be directly on the other layer or substrate, or intervening layers may also be present.

What is claimed is:

1. A method comprising:
    forming a first inter-metal dielectric layer above a semiconductor substrate;
    forming a first damascene pattern in the first inter-metal dielectric layer;
    forming a first barrier layer and a first metal layer in the first damascene pattern;
    forming a first metal line in the first damascene pattern by polishing the first metal layer and the first barrier layer to expose the surface of the first inter-metal dielectric layer;
    etching the first metal line such that the uppermost surface thereof is on a plane lower than a plane of the uppermost surface of the first inter-metal dielectric layer by performing a wet etching process on the first metal line using a mask pattern after forming the first metal line;
    forming a first metal capping layer above the first metal line; and
    forming a second inter-metal dielectric layer above the first metal capping layer.

2. The method of claim 1, wherein slurry used for the polishing process comprises a material having a higher etching selectivity to the first metal layer than to the first barrier layer.

3. The method of claim 1, wherein the first damascene pattern comprises a first via hole and a first trench, and the first metal capping layer is formed in the first trench.

4. The method of claim 1, wherein the first metal capping layer is formed by depositing at least one of Ti, SiN, SiCN, TiN, and Ru in the first damascene pattern.

5. The method of claim 1, wherein, in forming the first metal capping layer, a prescribed dielectric material is deposited on the first metal line.

6. The method of claim 1, wherein forming the second inter-metal dielectric layer comprises:
    forming a second damascene pattern including a second via hole and a second trench in the second inter-metal dielectric layer; and
    forming a second barrier layer, a second metal line, and a second metal capping layer in the second damascene pattern after forming the second damascene pattern.

7. The method of claim 6, wherein the second metal capping layer is formed above the second metal line in the second damascene pattern.

* * * * *